US007749894B2

United States Patent
Wang et al.

(10) Patent No.: US 7,749,894 B2
(45) Date of Patent: Jul. 6, 2010

(54) INTEGRATED CIRCUIT PROCESSING SYSTEM

(75) Inventors: Xianbin Wang, Singapore (SG); Juan Boon Tan, Singapore (SG); Liang-Choo Hsia, Singapore (SG); Teck Jung Tang, Johor Bahru (MY); Huang Liu, Saingapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 198 days.

(21) Appl. No.: 11/558,342

(22) Filed: Nov. 9, 2006

(65) Prior Publication Data

US 2008/0111238 A1 May 15, 2008

(51) Int. Cl.
*H01L 21/4763* (2006.01)
(52) U.S. Cl. ............... 438/631; 438/622; 257/E21.575; 257/E21.58; 257/E21.585
(58) Field of Classification Search ................ 257/752, 257/758, 760, 522, E21.575, E21.58, E21.583; 438/598, 622, 631
See application file for complete search history.

(56) References Cited

U.S. PATENT DOCUMENTS 6,147,009 A * 11/2000 Grill et al. ................. 438/780
6,916,696 B1 * 7/2005 Buynoski ................... 438/200
6,917,108 B2 * 7/2005 Fitzsimmons et al. ....... 257/751
6,958,526 B2   10/2005 Gates et al.
6,958,540 B2   10/2005 Gambino et al.
6,992,003 B2    1/2006 Spencer et al.
7,049,247 B2    5/2006 Gates et al.
2002/0031906 A1 * 3/2002 Jiang et al. ................. 438/622
2002/0037442 A1 * 3/2002 Grill et al. ................. 428/698
2003/0213617 A1 * 11/2003 Karthikeyan et al. ....... 174/258
2004/0002207 A1 * 1/2004 Yu ............................ 438/622
2006/0003576 A1   1/2006 Yeh et al.
2008/0014739 A1 * 1/2008 Matz et al. ................. 438/622

* cited by examiner

*Primary Examiner*—Thao X Le
*Assistant Examiner*—Robert Huber
(74) *Attorney, Agent, or Firm*—Mikio Ishimaru

(57) ABSTRACT

An integrated circuit processing system is provided including providing a substrate having an integrated circuit, forming an interconnect layer over the integrated circuit, applying a low-K dielectric layer over the interconnect layer, applying an ultra low-K dielectric layer over the low-K dielectric layer, forming an opening through the ultra low-K dielectric layer and the low-K dielectric layer to the interconnect layer, depositing an interconnect metal in the opening, and chemical-mechanical polishing the interconnect metal and the ultra low-K dielectric layer.

8 Claims, 4 Drawing Sheets

INTEGRATED CIRCUIT PROCESSING SYSTEM

TECHNICAL FIELD

The present invention relates generally to a method used in the fabrication of semiconductor integrated circuit devices, and more particularly to the formation of planarized structures of conducting copper lines and interconnects in the copper/low-K technology regime which adopts low-K as interlevel dielectric (ILD) using the CMP (Chemical and Mechanical Polish) technique.

BACKGROUND ART

In the field of semiconductor fabrication, the use of dielectric materials having a low dielectric constant, known as low-K materials, is well known. Low-K dielectrics are used primarily in backend processing. Backend processing refers generally to processing subsequent to the formation of transistors in the wafer substrate to interconnect the transistors, typically with multiple levels of interconnect. Each interconnect level is separated by an interlevel dielectric (ILD). The individual interconnects within a single interconnect level are also separated by a dielectric material that may or may not be the same as the ILD. Vias or contacts are formed in the ILD's and filled with conductive material to connect the interconnect levels in a desired pattern to achieve a desired functionality.

The spacing between adjacent interconnects within an interconnect level and the spacing between vertically adjacent levels have both decreased as device complexity and performance have increased. Minimizing cross coupling between the many signals within a device is now a significant design consideration. The primary source of signal cross coupling or cross talk is capacitive. A pair of adjacent interconnects, whether within a single interconnect level or in vertically adjacent interconnect levels, separated by an intermediate dielectric material form an unintended parallel plate capacitor. Minimizing cross coupling requires a minimization of the capacitance between any pair of adjacent interconnects, especially those interconnects that carry signals that switch a high frequency.

One popular approach to minimizing cross talk includes the use of low-K dielectric materials as the ILD. Low-K materials reduce cross talk because the capacitance of a parallel plate capacitor is directly proportional to the dielectric constant of the material between the capacitor plates. A lower dielectric constant material translates into a lower capacitance and a lower cross coupling.

Various low-K materials have been used in low-K backend processing with mixed results. Integration of low-K material into existing fabrication processes is particularly challenging in the case of backend processing that includes the use of chemical-mechanical polishing (CMP). CMP is a technique by which each interconnect level is formed in many existing processes. In a CMP process, as implied by its name, a film or layer is physically polished with a rotating polishing pad in the presence of a "slurry" that contains mechanical abrasion components and/or chemical components to produce a smooth upper surface and to remove excess conductive material and thereby isolate the individual interconnects from one another.

Low-K materials are generally not easily integrated into a CMP-based backend process. Conductive materials and Low-K materials tend to exhibit dishing and erosion and other forms of deterioration under chemical mechanical polishing and are susceptible to the polishing pressure and polishing time. To combat this problem, capping materials have been formed over the low-K dielectrics to act as a CMP stop. Unfortunately, adhesion between many materials used as low-K materials and other materials suitable for use as a CMP stopping layer is often not good. In addition, the capping materials with higher dielectric constants degrade the capacitive performance of the low-K materials. It would be desirable, therefore, to implement a process integrating low-K ILD's into a CMP backend process flow.

Thus, a need still remains for an integrated circuit processing system that integrates a low-K dielectric with a CMP process that doesn't weaken or damage the low-K ILD. In view of the demand for smaller integrated circuit geometries and the increasing operational frequencies of the end devices, it is increasingly critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides an integrated circuit processing system including providing a substrate having an integrated circuit, forming an interconnect layer over the integrated circuit, applying a low-K dielectric layer over the interconnect layer, applying an ultra low-K dielectric layer over the low-K dielectric layer, forming an opening through the ultra low-K dielectric layer and the low-K dielectric layer to the interconnect layer, depositing an interconnect metal in the opening, and chemical-mechanical polishing the interconnect metal and the ultra low-K dielectric layer.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
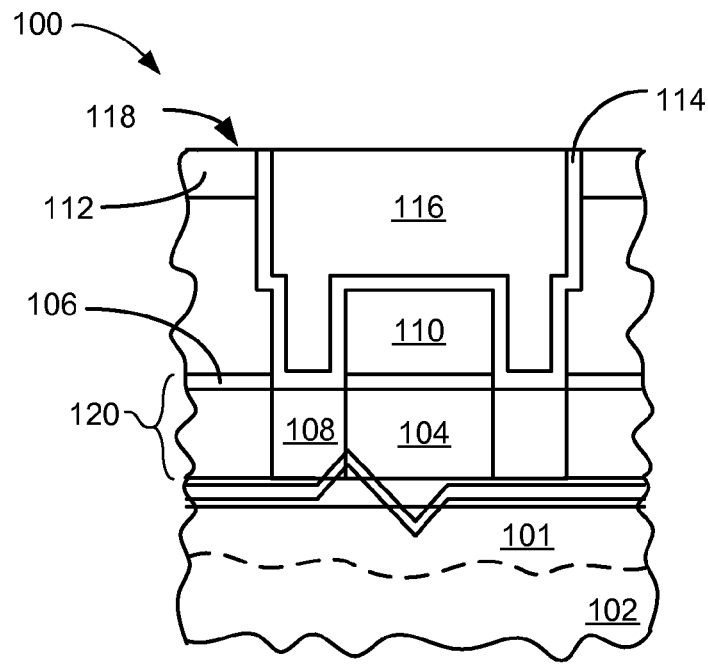
FIG. 1 is a partial cross-sectional view of an integrated circuit processing system, in an embodiment of the present invention.

In the following description, numerous specific details are given to provide a thorough understanding of the invention. However, it will be apparent that the invention may be practiced without these specific details. In order to avoid obscuring the present invention, some well-known process steps are not disclosed in detail. Likewise, the drawings showing embodiments of the apparatus are semi-diagrammatic and not to scale and, particularly, some of the dimensions are for the clarity of presentation and are shown greatly exaggerated in the drawing FIGS. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the wafer substrate regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material or photoresist, patterning, exposure, development, etching, cleaning, and/or removal of the material or photoresist as required in forming a described structure.

Referring now to FIG. 1, therein is shown a partial cross-sectional view of an integrated circuit processing system 100, in an embodiment of the present invention. The partial view depicts a substrate 102, having an integrated circuit 101 fabricated thereon (not shown), an inter-level dielectric layer 104 is deposited over the integrated circuit 101 and is covered by a cap layer 106, such as silicon nitride (SiN). An interconnect 108, such as a copper interconnect, is electrically connected to the integrated circuit through a contact layer (not shown).

A low-K dielectric layer 110 is deposited over the inter-level dielectric layer 104 and the cap layer 106. The inter-level dielectric layer 104 and the low-K dielectric layer 110 are substantially similar in the chemical make-up and dielectric value (K). An ultra low-K dielectric layer 112, such as an ultra low-K dielectric layer having a dielectric (K) value of less than 2.6, or the mechanically and/or chemically softer type of the low-K dielectric layer 110, or the mechanically and/or chemically softer type of the inter-level dielectric layer 104, is deposited over the low-K dielectric layer 110.

The dielectric layers may have dielectric constants from 4.2 to 3.9 and are of materials such as silicon oxide ($SiO_x$), tetraethylorthosilicate (TEOS), borophosphosilicate (BPSG) glass, etc. The low-K dielectric layers may have lower dielectric constants from 3.9 to 2.5 and are of materials such as fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), etc. The ultra-low dielectric layers may have ultra-low dielectric constants below 2.5 and are of such materials as polytetrafluoroethylene (PTFE) commercially available as Teflon-AF and Teflon microemulsion, polyimide nanofoams such as polypropylene oxide, silica aerogels, silica xerogels, and mesoporous silica. The above-mentioned low-K materials may also be used as ultra-low dielectric materials proposed in this invention as long as they present properties of relatively softer and show higher polishing rate than the low-K dielectric layer 110 as showed in FIG. 1.

A diffusion barrier layer 114, together with a seed metal layer is deposited over the low-K dielectric layer 110 and the ultra low-K dielectric layer 112, and inside the patterned via and trench. The diffusion barrier layer 114 may include an initial 200 Å layer of titanium (Ti), tantalum (Ta) or tantalum nitride (TaN) covered by a 500-2000 Å layer of copper (Cu). Within the diffusion barrier layer 114, an adhesion promoter, such as Ti, Ta or TaN is used as a diffusion barrier for the copper. An interconnect metal 116, such as copper, is deposited on the diffusion barrier layer 114. A structure surface 118 is formed by a chemical-mechanical polish establishing a coplanar surface between the interconnect metal 116 and the ultra low-K dielectric layer 112, or the low-K dielectric layer 110 if adopting a scheme to remove all the ultra low-K dielectric layer 112. An interconnect layer 120 is comprised of the inter-level dielectric layer 104 and the cap layer 106.

In the existing hard mask technology (not shown), the mechanical hardness of the hard mask layer (not shown) makes it difficult to remove during the CMP. The hard mask (not shown) may represent a higher K material, so its complete removal is desired. During the removal process, the interconnect metal 116 may develop large dishing, such as a concave surface characteristic, or erosion as a result of extended polishing time in the hard mask (not shown) CMP. The dishing issue can reduce the effective thickness of the interconnect metal 116 and reduce the electrical performance of the process. If the CMP does not remove all of the higher K value hard mask (not shown), the integrated circuit 101 may develop high frequency shorts or display cross-talk interference between high frequency lines.

In the present invention, the presence of residual ULK soft mask, such as the ultra low-K dielectric layer 112, or the mechanically and/or chemically softer type of the low-K dielectric layer 110, or the mechanically and/or chemically softer type of the inter-level dielectric layer 104, does not degrade the high frequency operation of the integrated circuit 101. Since the deposition of the ultra low-K dielectric layer 112, the low-K dielectric layer 110, or the inter-level dielectric layer 104 may create layers of irregular thickness, the chemical-mechanical polishing may create a surface having the ultra low-K dielectric layer 112, the low-K dielectric layer 110, the inter-level dielectric layer 104, or a combination thereof coplanar with the interconnect metal 116 without impacting the frequency performance of the integrated circuit 101. The reduced polishing pressure and polishing time used for ultra low-K also reduces the wear on the interconnect metal 116, which alleviates the dishing issue previously described.

Figure 2:
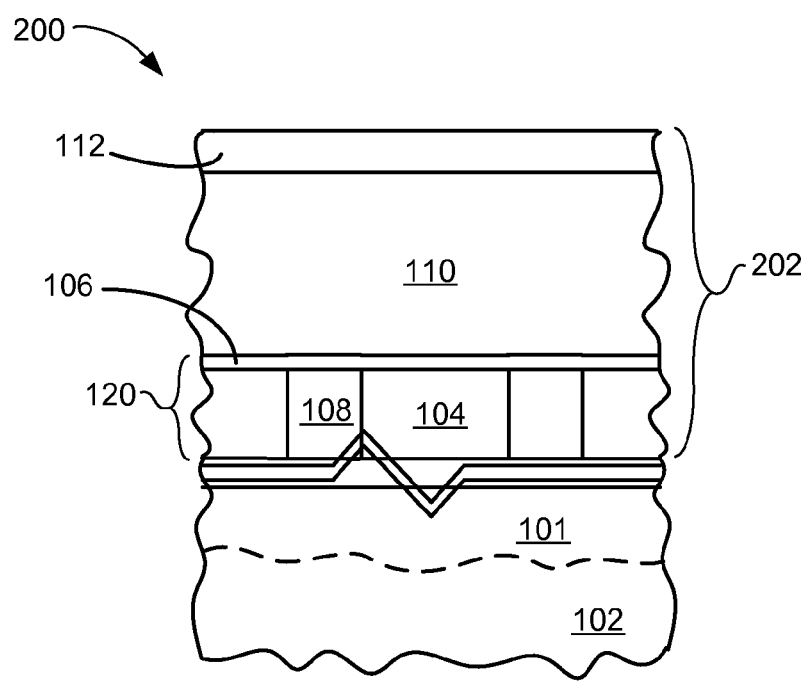
FIG. 2 is a partial cross-sectional view of an interconnect layer stack of an integrated circuit processing system, in an embodiment of the present invention.

Referring now to FIG. 2, therein is shown a partial cross-sectional view of an interconnect layer stack 202 of the integrated circuit processing system 100, in an embodiment of the present invention. The partial cross-sectional view of the interconnect layer stack 202 depicts the inter-level dielectric layer 104 (ILD) having a low-K where the dielectric constant value (K) is around 3.0 or less. The partial cross-sectional view also depicts the interconnect 108 and the cap layer 106, such as silicon nitride (SiN). The interconnect layer 120 is formed of the inter-level dielectric layer 104, the interconnect 108 and the cap layer 106. The low-K dielectric layer 110, having a low-K substantially similar to the inter-level dielectric layer 104, is deposited on the cap layer 106.

The ultra low-K dielectric layer 112 is deposited on the low-K dielectric layer 110, wherein the ultra low-K dielectric layer 112, such as HOSP or a-CF, has a dielectric constant (K) of less than or equal to 2.6. The thin film of the ultra low-K dielectric layer 112 is in the range of 300 to 1000 Å, with the target thickness of 600 Å. The ultra low-K dielectric layer 112 constitutes a ULK soft mask with softer characteristics both mechanically and chemically.

Figure 3:
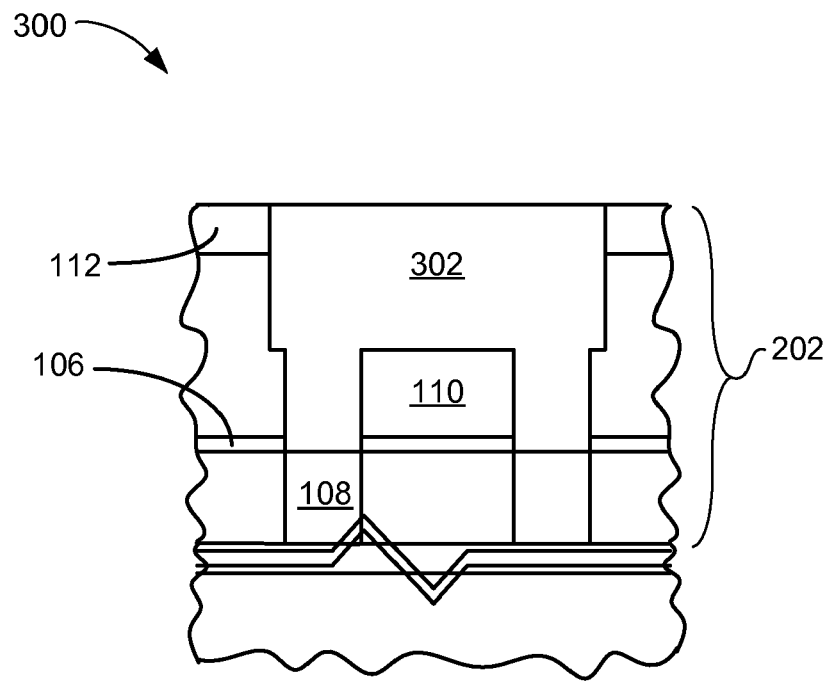
FIG. 3 is a partial cross-sectional view of the interconnect layer stack, of FIG. 2, in an etch process.

Referring now to FIG. 3, therein is shown a partial cross-sectional view of the interconnect layer stack 202, of FIG. 2, in an etch process. The partial cross-sectional view depicts the interconnect layer stack 202 having been patterned and etched in preparation for metal deposition. An opening 302 extends through the cap layer 106, the low-K dielectric layer 110, and the ultra low-K dielectric layer 112. This etching process opens the connection path to the interconnect 108 for further connection.

The softer chemical properties of the ultra low-K dielectric layer 112 allow a consistent opening to be formed between the ultra low-K dielectric layer 112 and the low-K dielectric layer 110 during the etch process. The consistent opening is formed because the ultra low-K dielectric layer 112 etches faster than the underlying low-K ILD, such as the low-K dielectric layer 110, removing any possibility of an overhang. In the existing hard mask technology (not shown), the hard mask etches at a slower rate than the underlying low-K ILD, such as the low-K dielectric layer 110. The result may be an overhang of the hard mask (not shown) that makes subsequent processing difficult. The ultra low-K dielectric layer 112 has an etch rate similar to the underlying low-K ILD, such as the low-K dielectric layer 110. As a result, the etched opening has no overhang issue and is completely open for ease of further processing.

Figure 4:
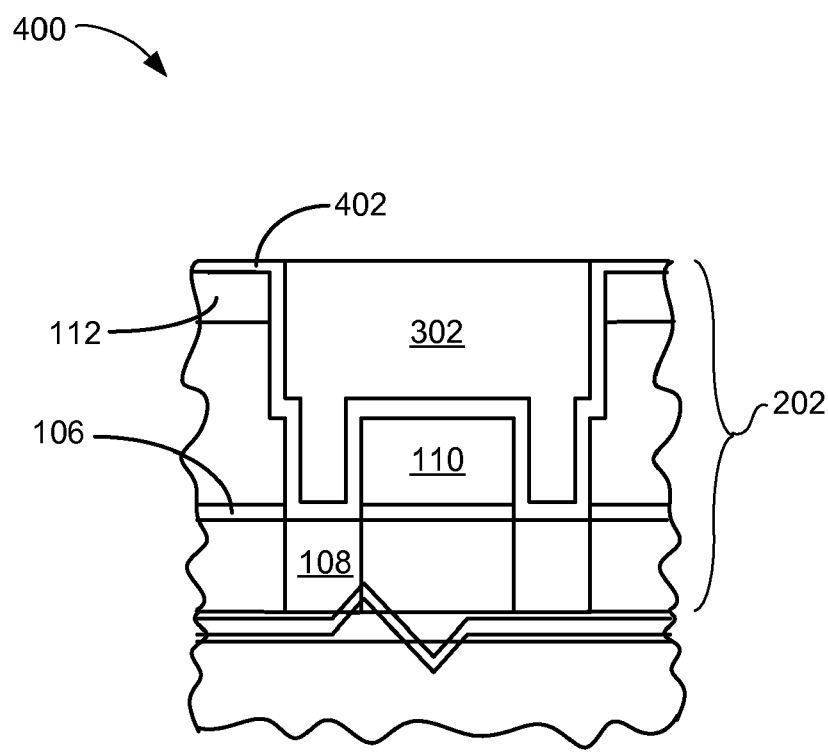
FIG. 4 is a partial cross-sectional view of the interconnect layer stack, of FIG. 3, in a seed metal deposition process.

Referring now to FIG. 4, therein is shown a partial cross-sectional view of the interconnect layer stack 202, of FIG. 3, in a seed metal deposition process. The partial cross-sectional view depicts the interconnect layer stack 202 having had a diffusion barrier layer 402 deposited over the surface of the opening 302 and attaches directly to the interconnect 108. The diffusion barrier layer 402 may constitute an initial 200 Å layer of Ti or Ta covered by a 500-2000 Å layer of copper (Cu).

In the existing hard mask technology (not shown) an overhang may exist between the mask layer and the underlying ILD, such as the low-K dielectric layer 110. The deposition of the diffusion barrier layer 402 becomes very difficult in the event of an overhang. Secondary processing is required to fill the void in the diffusion barrier layer 402 caused by the overhang (not shown). If this issue is not addressed, substantial processing issues and reliability issues will ensue. The use of the ultra low-K dielectric layer 112 alleviates the overhang (not shown) issue. The similar etch rates of the ultra low-K dielectric layer 112 and the low-K dielectric layer 110 allows the direct adhesion of the diffusion barrier layer 402, without additional secondary processes.

Figure 5:
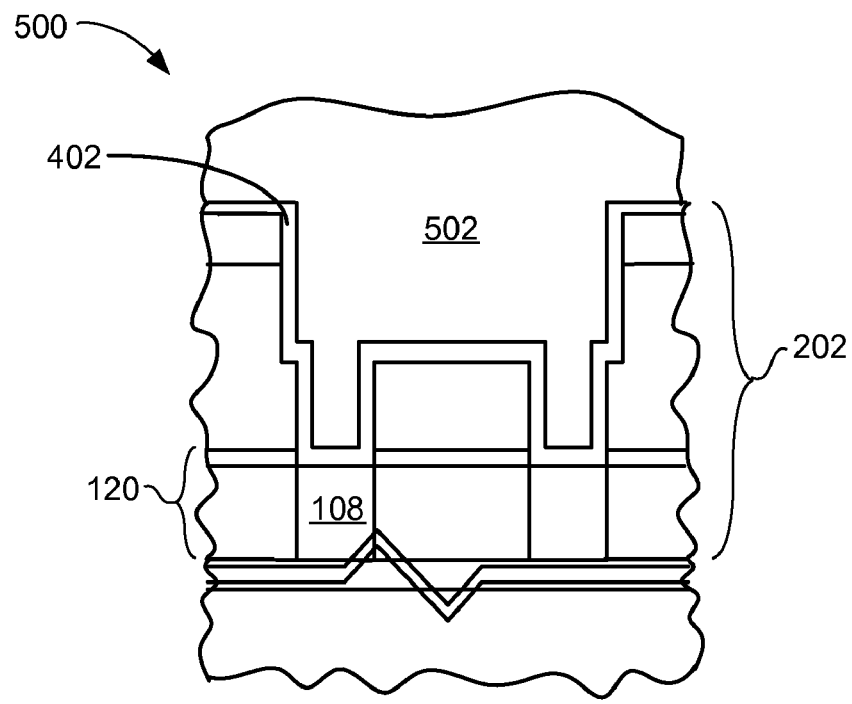
FIG. 5 is a partial cross-sectional view of the interconnect layer stack, of FIG. 4, in a metal deposition process.

Referring now to FIG. 5, therein is shown a partial cross-sectional view of the interconnect layer stack 202, of FIG. 4, in a metal deposition process. The partial cross-sectional view depicts the interconnect layer stack 202 having had an interconnect metal 502, such as copper, deposited on the diffusion barrier layer 402. The interconnect metal 502 forms and electrical connection through the diffusion barrier layer 402 to the interconnect 108 of the interconnect layer 120.

The deposition of the interconnect metal 502 shows a solid adhesion to the diffusion barrier layer 402 without voids. In the hard mask technology (not shown) the risk of voids in the deposition of the interconnect metal 502 is possible and may lead to further process difficulties and reliability issues.

Figure 6:
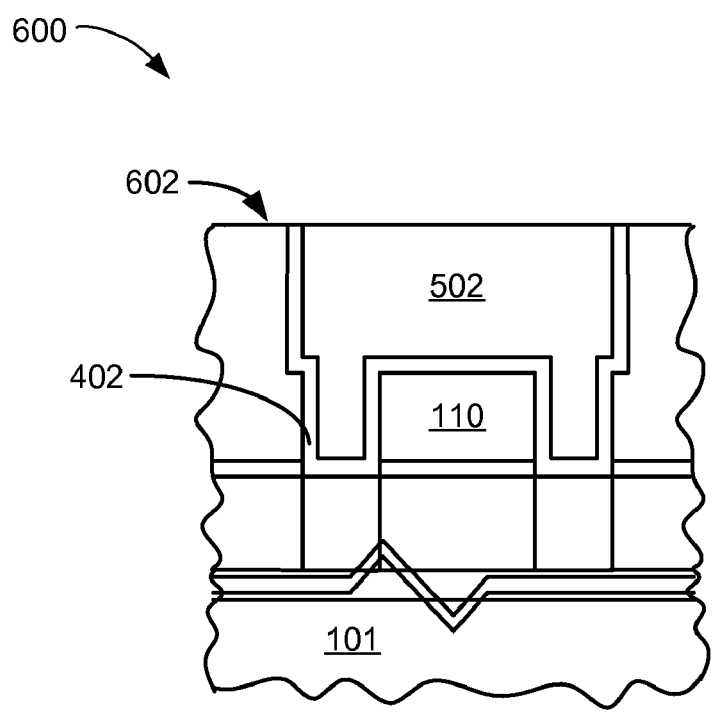
FIG. 6 is a partial cross-sectional view of an integrated circuit processing system, in an alternative embodiment of the present invention.

Referring now to FIG. 6, therein is shown a partial cross-sectional view of an integrated circuit processing system 600, in an alternative embodiment of the present invention. The partial cross-sectional view depicts a structure surface 602 formed by the interconnect metal 502 and the diffusion barrier layer 402 polished down to a flat, electrically isolated contact surrounded by and coplanar with the low-K dielectric layer 110. The CMP utilizes a polishing pad (not shown) and a slurry (not shown), containing an abrasive material, to polish the surface down to a smooth flat finish.

The softer mechanical properties of the ultra low-K dielectric layer 112, of FIG. 1, allow a shorter chemical-mechanical polishing (CMP) cycle than the existing hard mask technologies (not shown). A typical CMP process for the reduction of the hard mask layer (not shown), can take nominally 60 seconds at a polishing pressure of 0.6 pounds per square inch (psi), while the reduction of the ULK soft mask, the ultra low-K dielectric layer 112, can take nominally 20 seconds at the polishing pressure of 0.6 psi. The reduction in process time at a low pressure for the CMP reduces the occurrence of damage to the underlying ILD, such as the low-K dielectric layer 110. The damage to the underlying ILD, such as the low-K dielectric layer 110 may include cracks in the structure, surface scratches, surface dishing, such as forming a concave surface, or a combination thereof.

In the existing hard mask technology (not shown), the mechanical hardness of the hard mask layer (not shown) may make it difficult to remove during the CMP. The hard mask (not shown) represents a higher K material, so its complete removal is desired. During the removal process, the interconnect metal 502 may develop a dishing, such as a concave surface characteristic, or erosion as a result of extended polishing time in the hard mask (not shown) CMP. The dishing issue can reduce the effective thickness of the interconnect metal 502 and reduce the electrical performance of the process. If the CMP does not remove all of the higher K value hard mask (not shown), the integrated circuit 101, of FIG. 1, may develop high frequency performance issues due to increased capacitance.

In the present invention, the mechanical and chemical softness of the ULK soft mask, such as the ultra low-K dielectric layer 112, allows complete removal of the ultra low-K dielectric layer 112. The reduced polishing pressure and polishing time for ultra low-K film also reduces the wear on the interconnect metal 502, which alleviates the dishing issue previously described.

Figure 7:
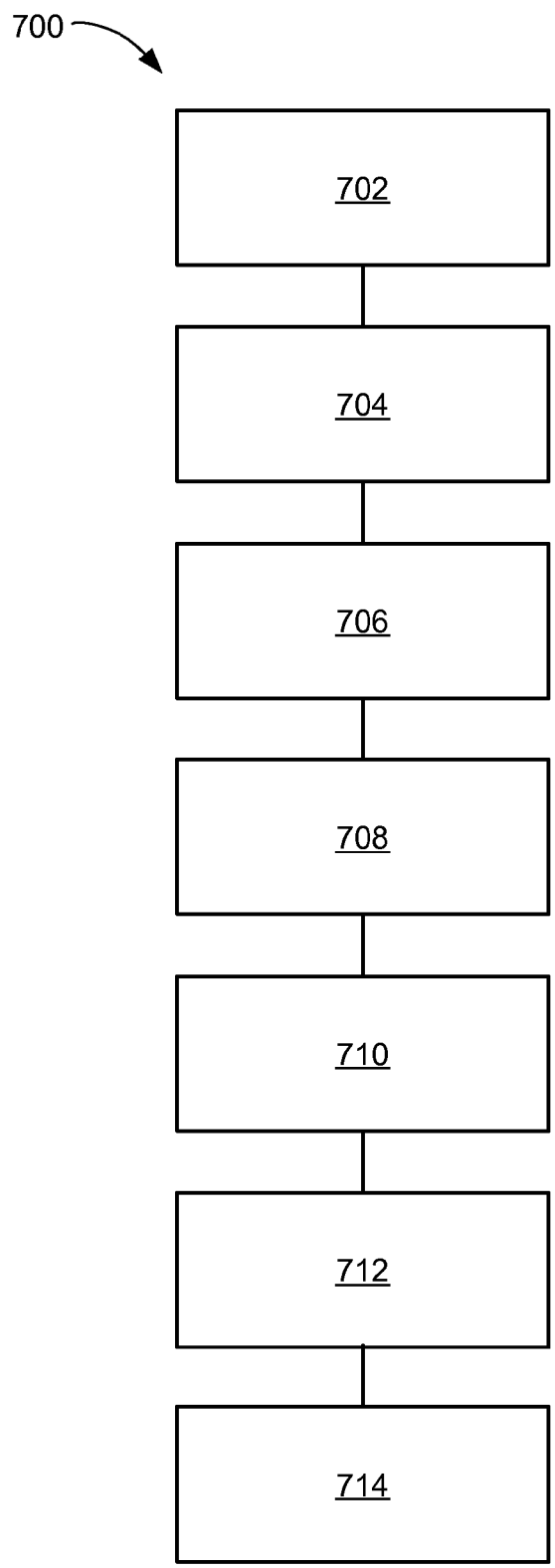
FIG. 7 is a flow chart of an integrated circuit processing system for the manufacture of the integrated circuit processing system, in accordance with an embodiment of the present invention.

Referring now to FIG. 7, therein is shown a flow chart of an integrated circuit processing system 700 for the manufacture of the integrated circuit processing system 100, in accordance with an embodiment of the present invention. The system 700 includes providing a substrate having an integrated circuit in a block 702; forming an interconnect layer over the integrated circuit in a block 704; applying a low-K dielectric layer over the interconnect layer in a block 706; applying an ultra low-K dielectric layer over the low-K dielectric layer in a block 708; forming an opening through the ultra low-K dielectric layer and the low-K dielectric layer to the interconnect layer in a block 710; depositing an interconnect metal in the opening in a block 712; and chemical-mechanical polishing the interconnect metal and the ultra low-K dielectric layer in a block 714.

In greater detail, a method to manufacture the integrated circuit processing system in an embodiment of the present invention, is performed as follows:

1. Providing a substrate having an integrated circuit. (FIG. 1)
2. Forming an interconnect layer over the integrated circuit including providing an interconnect within the interconnect layer. (FIG. 1)
3. Applying a low-K dielectric layer over the interconnect layer. (FIG. 2)
4. Applying an ultra low-K dielectric layer over the low-K dielectric layer includes providing a soft mask comprised of the ultra low-K dielectric layer. (FIG. 2)

5. Forming an opening through the ultra low-K dielectric layer and the low-K dielectric layer to the interconnect layer includes forming an opening in the cap layer. (FIG. 4)
6. Depositing interconnect metal in the opening provides forming a connection to the interconnect within the interconnect layer. (FIG. 4) and
7. Chemical-mechanical polishing the interconnect metal and the ultra low-K dielectric layer further comprises forming a structure surface. (FIG. 6)

It has been discovered that the integrated circuit processing system as described in the present invention, represents an increase in device performance while making the device more reliable and easier to manufacture.

It has been discovered that the present invention thus has numerous aspects.

An aspect of the present invention is that it reduces topography such as dishing, erosion, low-K ILD thinning and variation, alleviating the difficulties in fabrication of the subsequent metal layers.

Another aspect is that the present invention reduces potential damage to the low-K ILD surrounding the interconnect structures, while preserving the high frequency performance of the electrical device.

Yet another aspect is that the present invention simplifies the manufacturing process and removes previous technology restrictions that impacted both the time required to manufacture and the reliability of the electrical devices. By replacing the hard mask of the current technology with the ULK soft mask of the present invention, several process steps are eliminated, such as the repair of the seed metal void under the overhang from the etch process and the elimination of the requirement to remove all of the mask layer between interconnect layers. The process is also made more robust by eliminating or reducing the amount of cracks in the low-K ILD.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit processing system method and apparatus of the present invention furnish important and heretofore unknown and unavailable solutions, capabilities, and functional aspects for small geometry, such as 90 nm and smaller, integrated circuit manufacturing with low-K dielectric. The resulting processes and configurations are straightforward, cost-effective, uncomplicated, highly versatile and effective, can be implemented by adapting known technologies, and are thus readily suited for efficiently and economically manufacturing integrated circuit devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method of manufacturing an integrated circuit processing system comprising:
   providing a substrate having an integrated circuit;
   forming an interconnect layer over the integrated circuit;
   applying a low-K dielectric layer over the interconnect layer;
   applying an ultra low-K dielectric layer over the low-K dielectric layer;
   forming an opening through the ultra low-K dielectric layer and the low-K dielectric layer to the interconnect layer;
   depositing an interconnect metal in the opening; and
   chemical-mechanical polishing the interconnect metal and the ultra low-K dielectric layer provides the interconnect metal coplanar with the low-K dielectric layer.

2. The method as claimed in claim 1 further comprising providing a diffusion barrier layer between the low-K dielectric layer and the interconnect metal.

3. The method as claimed in claim 1 wherein polishing the interconnect metal comprises the interconnect metal is coplanar with the ultra low-K dielectric layer.

4. The method as claimed in claim 1 further comprising providing a cap layer between the low-K dielectric layer and the interconnect layer.

5. A method of manufacturing an integrated circuit processing system comprising:
   providing a substrate having an integrated circuit;
   forming an interconnect layer over the integrated circuit including providing an interconnect within the interconnect layer;
   applying a low-K dielectric layer over the interconnect layer;
   applying an ultra low-K dielectric layer over the low-K dielectric layer includes providing a soft mask comprised of the ultra low-K dielectric layer;
   forming an opening through the ultra low-K dielectric layer and the low-K dielectric layer to the interconnect layer includes forming an opening in a cap layer;
   depositing interconnect metal in the opening to form a connection to the interconnect within the interconnect layer; and
   chemical-mechanical polishing the interconnect metal and the ultra low-K dielectric layer provides the interconnect metal coplanar with the low-K dielectric layer.

6. The method as claimed in claim 5 further comprising providing a diffusion barrier layer between the low-K dielectric layer and the interconnect metal wherein the diffusion barrier layer forms a barrier to the interconnect metal.

7. The method as claimed in claim 5 wherein polishing the interconnect metal comprises the interconnect metal is coplanar with the ultra low-K dielectric layer and a diffusion barrier layer.

8. The method as claimed in claim 5 wherein providing the cap layer between the low-K dielectric layer and the interconnect layer includes the cap layer is silicon nitride.

* * * * *